(12) United States Patent
Chiu et al.

(10) Patent No.: US 9,070,634 B1
(45) Date of Patent: Jun. 30, 2015

(54) SEMICONDUCTOR DEVICE COMPRISING A SURFACE PORTION IMPLANTED WITH NITROGEN AND FLUORINE

(71) Applicant: MACRONIX International Co., Ltd., Hsinchu (TW)

(72) Inventors: Chien-Lan Chiu, Hsinchu (TW); Yung-Tai Hung, Hsinchu (TW); Chin-Ta Su, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/141,391

(22) Filed: Dec. 26, 2013

(51) Int. Cl.
*H01L 21/00* (2006.01)
*H01L 21/3105* (2006.01)
*H01L 21/02* (2006.01)
*H01L 23/29* (2006.01)

(52) U.S. Cl.
CPC ...... *H01L 21/31055* (2013.01); *H01L 21/0214* (2013.01); *H01L 21/02164* (2013.01); *H01L 21/0217* (2013.01); *H01L 23/291* (2013.01); *H01L 21/02359* (2013.01)

(58) Field of Classification Search
CPC .......... H01L 21/02359; H01L 21/02164; H01L 21/0214; H01L 21/0217
See application file for complete search history.

(56) References Cited

U.S. PATENT DOCUMENTS

| | | | |
|---|---|---|---|
| 2006/0237803 A1* | 10/2006 | Zhu et al. | 257/410 |
| 2008/0135953 A1* | 6/2008 | Siprak | 257/411 |
| 2009/0178271 A1* | 7/2009 | Egitto et al. | 29/620 |
| 2011/0136317 A1* | 6/2011 | Kang et al. | 438/396 |
| 2012/0115331 A1* | 5/2012 | Koh et al. | 438/694 |
| 2013/0236710 A1* | 9/2013 | Honda et al. | 428/212 |

* cited by examiner

*Primary Examiner* — Ngan Ngo
(74) *Attorney, Agent, or Firm* — J.C. Patents

(57) ABSTRACT

A method of fabricating a semiconductor device is provided. A substrate is provided. Thereafter, a dielectric layer is formed on the substrate, wherein the dielectric layer includes a first portion adjacent to the substrate and a second portion adjacent to the first portion. Afterwards, the dielectric layer is treated with nitrogen trifluoride ($NF_3$) to remove the second portion of the dielectric layer and therefore expose the first portion of the dielectric layer. A semiconductor device is also provided.

21 Claims, 5 Drawing Sheets

SEMICONDUCTOR DEVICE COMPRISING A SURFACE PORTION IMPLANTED WITH NITROGEN AND FLUORINE

BACKGROUND OF THE INVENTION

1. Field of Invention

The present invention relates to a semiconductor device and a method of fabricating the same.

2. Description of Related Art

As the size of a metal oxide semiconductor continues to decrease, the requirement for the quality of a dielectric layer is getting higher. The conventional dielectric layer is formed with a rough surface having defects such as protrusion or recesses therein, so that the roughness of the surface of the dielectric layer is high. In the following patterning processes such as photolithography and etching processes, the high roughness of the dielectric layer causes poor adhesion between films in the film stack, or even results in bridge defects, cracks, peeling or leakage current of the device.

SUMMARY OF THE INVENTION

The present invention provides a semiconductor device and a method of fabricating the same, in which a dielectric layer is formed with low surface defect, low surface roughness and high adhesion to another material layer.

The present invention provides a method of fabricating a semiconductor device. A substrate is provided. A dielectric layer is formed on the substrate, wherein the dielectric layer includes a first portion adjacent to the substrate and a second portion adjacent to the first portion. The dielectric layer is treated with nitrogen trifluoride ($NF_3$) to remove the second portion of the dielectric layer and therefore expose the first portion of the dielectric layer.

According to an embodiment of the present invention, the dielectric layer includes silicon oxide, silicon nitride, silicon oxynitride or a combination thereof.

According to an embodiment of the present invention, the dielectric layer includes an interlayer dielectric layer, a dielectric layer between metal layers or a protection layer.

According to an embodiment of the present invention, the step of treating the dielectric layer with $NF_3$ includes implanting nitrogen and fluorine into a surface portion of the first portion, so as to form the surface portion implanted with nitrogen and fluorine.

According to an embodiment of the present invention, a thickness ratio of the surface portion implanted with nitrogen and fluorine to the first portion of the dielectric layer ranges from 1/150 to 1/14.

According to an embodiment of the present invention, a thickness of the surface portion implanted with nitrogen and fluorine ranges from 1 to 250 angstroms.

According to an embodiment of the present invention, a thickness of the second portion ranges from 50 to 1,000 angstroms.

According to an embodiment of the present invention, the step of treating the dielectric layer with $NF_3$ includes modulating at least one process parameter, and the process parameter includes a radio frequency (RF) power, a flow rate of $NF_3$, a flow rate of a carrier gas, a flow rate of $NH_3$, a flow rate of argon, a servo pressure or a combination thereof.

According to an embodiment of the present invention, the carrier gas includes helium.

According to an embodiment of the present invention, the RF power ranges from 20 to 200 W.

According to an embodiment of the present invention, the flow rate of $NF_3$ ranges from 35 to 250 sccm (standard cubic centimeter per minute).

According to an embodiment of the present invention, the flow rate of the carrier gas ranges from 20 to 2,400 sccm.

According to an embodiment of the present invention, the flow rate of $NH_3$ ranges from 0 to 300 sccm.

According to an embodiment of the present invention, the flow rate of argon ranges from 100 to 1,000 sccm.

According to an embodiment of the present invention, the method further includes forming at least one material layer on the exposed first portion of the dielectric layer.

According to an embodiment of the present invention, the at least one material layer includes an anti-reflection coating layer, a photoresist layer or a combination thereof.

The present invention further provides a semiconductor device including a substrate and a dielectric layer. The dielectric layer is disposed on the substrate and includes a surface portion implanted with nitrogen and fluorine, wherein a thickness ratio of the surface portion to the dielectric layer ranges from 1/150 to 1/14.

According to an embodiment of the present invention, the dielectric layer includes silicon oxide, silicon nitride, silicon oxynitride or a combination thereof.

According to an embodiment of the present invention, the dielectric layer includes an interlayer dielectric layer, a dielectric layer between metal layers or a protection layer.

According to an embodiment of the present invention, the semiconductor device further includes at least one material layer disposed on the dielectric layer.

According to an embodiment of the present invention, the at least one material layer includes an anti-reflection coating layer, a photoresist layer or a combination thereof.

In view of the above, with the fabricating method of the semiconductor device of the invention, the surface defects of the dielectric layer can be effectively removed, the surface roughness of the dielectric layer can be significantly decreased, and the adhesion within the film stack can be greatly improved. In other words, the dielectric layer of the semiconductor device of the invention can be formed with low surface defect, low roughness and high adhesion to another material layer, so that the performance of the device can be greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
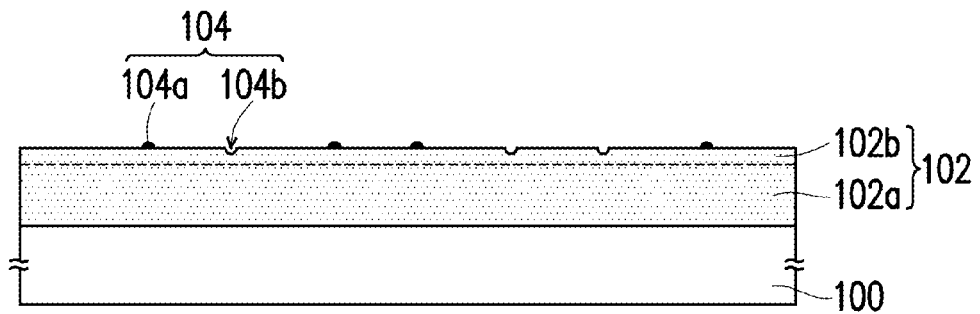
FIG. 1A to FIG. 1E are schematic cross-sectional views of a method of fabricating a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views of a method of fabricating a semiconductor device according to an embodiment of the present invention. FIG. 2 is a flow chart of a method of fabricating a semiconductor device according to an embodiment of the present invention.

Figure 2:
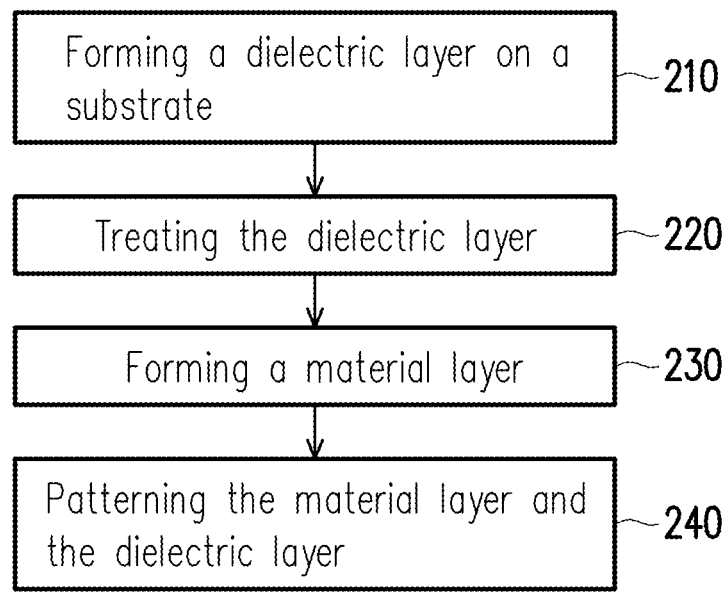
FIG. 2 is a flow chart of a method of fabricating a semiconductor device according to an embodiment of the present invention.

Referring to FIG. 1A and FIG. 2, a step 210 in implemented, in which a dielectric layer 102 is formed on a substrate 100. The substrate 100 can be a semiconductor substrate, such as a silicon substrate. The substrate 100 can be a silicon-on-insulator (SOI) substrate. The dielectric layer 102 can be an interlayer dielectric layer, a dielectric layer between metal layers or a protection layer. The dielectric layer 102 can have a single-layer or multi-layer structure. The dielectric layer 102 includes silicon oxide, silicon nitride, silicon oxynitride or a combination thereof. The method of forming the dielectric layer 102 includes performing a chemical vapor deposition or a coating process.

In an embodiment, the dielectric layer 102 includes a first portion 102a and a second portion 102b. The first portion 102a is disposed adjacent to the substrate 100. The second portion 102b is disposed adjacent to the first portion 102a. In this embodiment, the second portion 102b is disposed on the first portion 102a. The second portion 102b of the dielectric layer 102 has surface defects 104 in the surface thereof. The surface defects 104 can be protrusions 104a or recesses 104b generated during the deposition or coating process of the step of forming the dielectric layer 102. In the figure, the dielectric layer 102 is directly in contact with the substrate 100. However, the present invention is not limited thereto. In another embodiment, at least one intermediate layer can be included between the dielectric layer 102 and the substrate 100. The intermediate layer includes an insulating layer, a conductive layer, a semiconductor layer or a combination thereof.

Figure 1B:
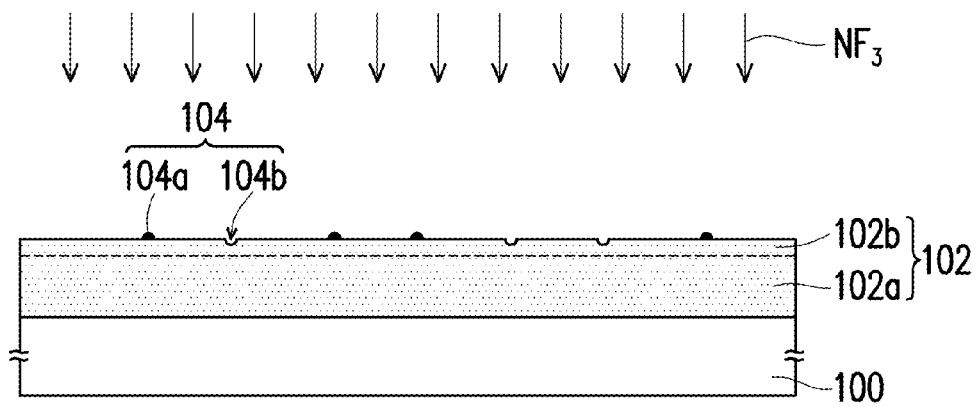
Figure 1C:
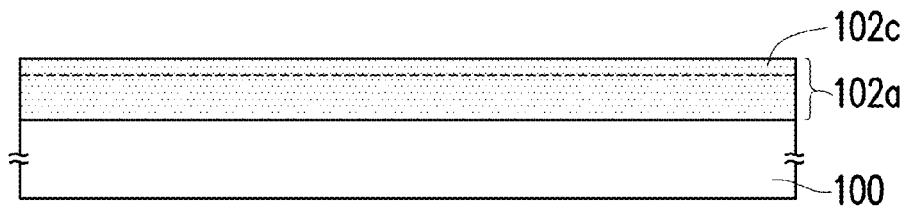

Referring to FIG. 1B to FIG. 1C and FIG. 2, a step 220 is implemented, in which the dielectric layer 102 is treated with nitrogen trifluoride ($NF_3$) (as shown in FIG. 1B), to remove the second portion 102b of the dielectric layer 102 and therefore expose the first portion 102a of the dielectric layer 102 (as shown in FIG. 1C). During the step of treating the dielectric layer 102 with $NF_3$, silicon atoms within the dielectric layer 102 are reacted with fluorine atoms from $NF_3$ to form $SiF_4$, so as to remove the second portion 102b of the dielectric layer 102. Besides, the step of removing the second portion 102b of the dielectric layer 102 can simultaneously remove the surface defects 104. The removed thickness of the second portion 102b ranges from 50 to 1,000 angstroms, for example.

The step of treating the dielectric layer 102 with $NF_3$ includes modulating at least one process parameter, and the process parameter includes a radio frequency (RF) power, a flow rate of $NF_3$, a flow rate of a carrier gas, a flow rate of $NH_3$, a flow rate or argon or a combination thereof. In an embodiment, the RF power ranges from 20 to 200 W; the flow rate of $NF_3$ ranges from 35 to 250 sccm; the carrier gas includes an inert gas, such as helium or argon, the flow rate of helium ranges from 20 to 2,400 sccm, and the flow rate of argon ranges from 100 to 1,000 sccm; and the flow rate of $NH_3$ ranges from 0 to 300 sccm.

In an embodiment, as shown in FIG. 1B and FIG. 1C, the step of treating the dielectric layer 102 with $NF_3$ includes implanting nitrogen and fluorine not only in the second portion 102b but also in the first portion 102a of the dielectric layer 102. Therefore, after the second portion 102b and the surface defects 104 are removed from the dielectric layer 102, the surface portion 102c of the first portion 102a still have nitrogen and fluorine implanted. The thickness ratio of the surface portion 102c to the first portion 102a of the dielectric layer 102 ranges from 1/150 to 1/14. In an embodiment, the thickness of the surface portion 102c ranges from 1 to 250 angstroms. The surface portion 102c has a nitrogen concentration of $1\times10^{17}$ to $2\times10^{18}$ atom/$cm^3$ and a fluorine concentration of $8\times10^{19}$ to $3\times10^{20}$ atom/$cm^3$.

Figure 1D:
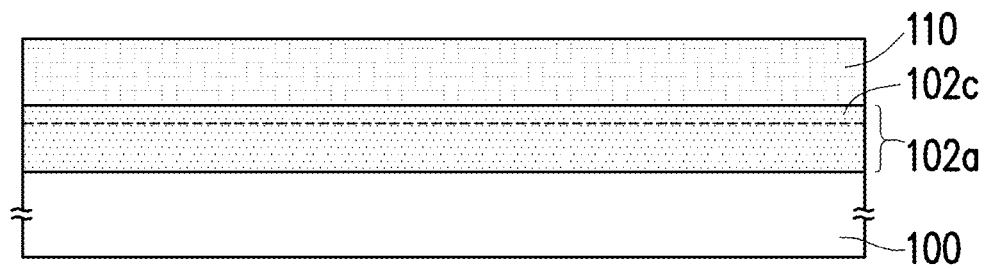

Referring to FIG. 1D and FIG. 2, a step 230 is implemented, in which at least one material layer 110 is formed on the exposed first portion 102a of the dielectric layer 102. The material layer 110 can have a single-layer or multi-layer structure. In an embodiment, the material layer 110 can be an anti-reflection coating layer, a photoresist layer or a combination thereof. In an embodiment, the material layer 110 includes an insulating layer, a conductive layer, a metal layer or a combination thereof.

Figure 1E:
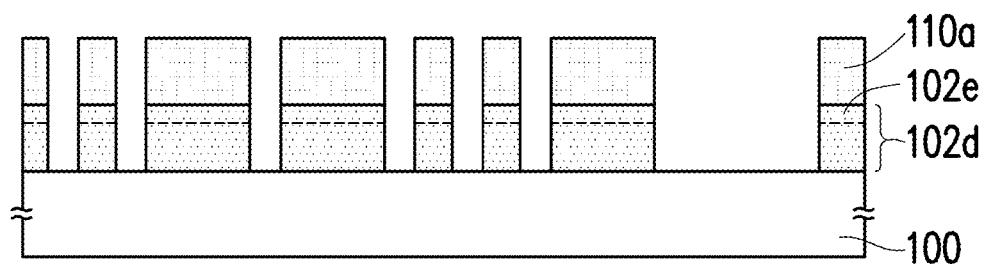

Referring to FIG. 1E and FIG. 2, a step 240 is implemented, in which the material layer 110 and the dielectric layer 102 are patterned to form a patterned material layer 110a and a patterned dielectric layer 102d. The patterning step includes photolithography and etching processes.

Herein, the semiconductor device of the invention is illustrated with reference with FIG. 1E. As shown in FIG. 1E, the semiconductor device includes a substrate 100 and a patterned dielectric layer 102d disposed on the substrate 100. The patterned dielectric layer 102d has a surface portion 102e implanted with nitrogen and fluorine. Besides, the thickness ratio of the surface portion 102e to the patterned dielectric layer 102d ranges from 1/150 to 1/14.

Figure 3A:
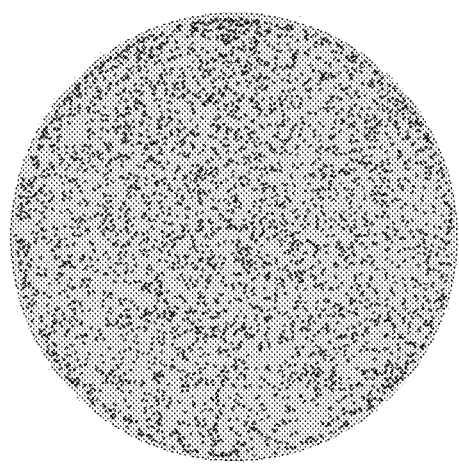
FIG. 3A is a defect map of the silicon oxide layer without a $NF_3$ treatment.
Figure 3B:
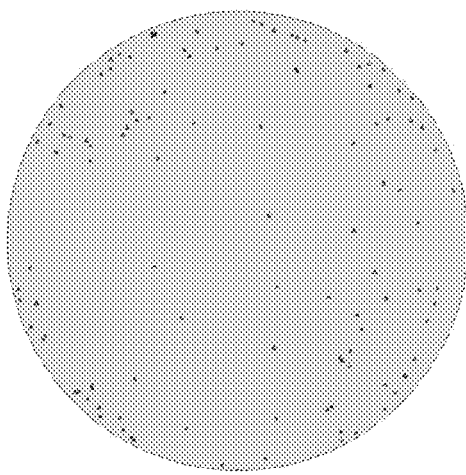
FIG. 3B is a defect map of the silicon oxide layer having been treated with $NF_3$.

FIG. 3A is a defect map of the silicon oxide layer without a $NF_3$ treatment. FIG. 3B is a defect map of the silicon oxide layer having been treated with $NF_3$.

Referring to FIG. 3A and FIG. 3B, the silicon oxide layer without a $NF_3$ treatment has a surface defect number of 4,193, while the silicon oxide layer having been treated with $NF_3$ has a surface defect number of 145. The results show that the $NF_3$ treatment is beneficial to effectively reduce the surface defects.

Figure 4:
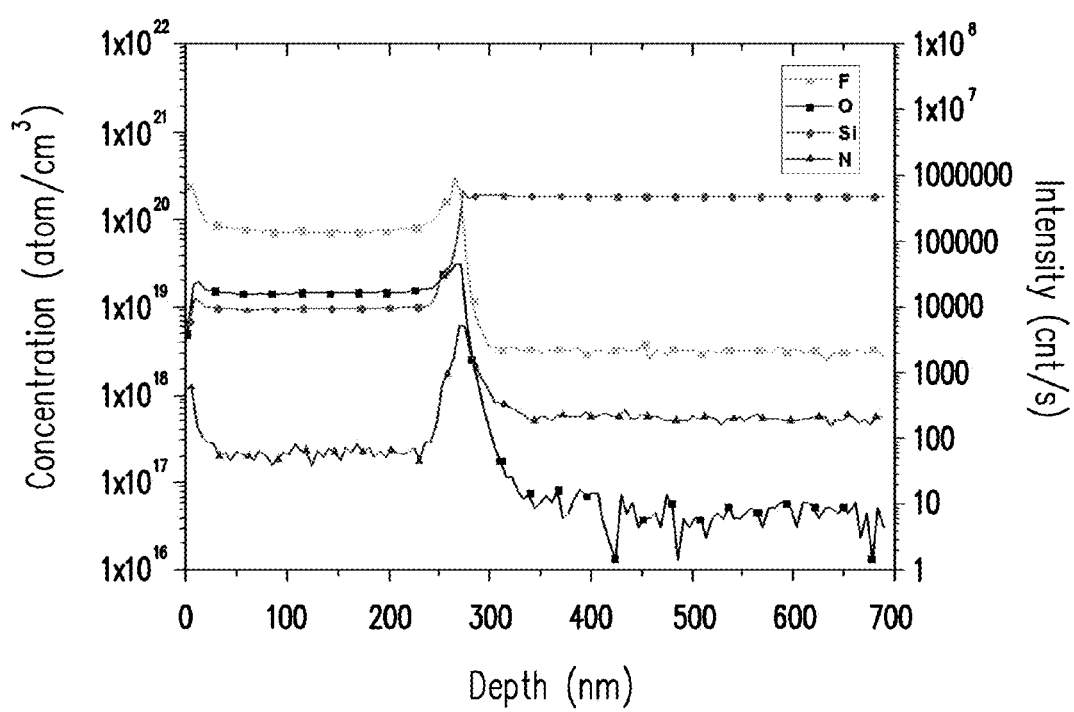
FIG. 4 is a secondary ion mass spectrometry (SIMS) graph of the silicon oxide layer having been treated with $NF_3$.

FIG. 4 is a secondary ion mass spectrometry (SIMS) graph of the silicon oxide layer having been treated with $NF_3$.

Referring to FIG. 4, upon the $NF_3$ treatment, the resulting dielectric layer is analysed with SIMS and the result shows that there exists nitrogen and fluorine at a depth of 1 to 200 angstroms from the surface of the dielectric layer. In other words, with the $NF_3$ treatment of the invention, the dielectric layer is thinned to remove the surface defects thereof, and a few amount of nitrogen and fluorine atoms remain in the remaining dielectric layer. The few amount of nitrogen and fluorine atoms do not affect the properties (e.g. dielectric constant or hardness) of the dielectric layer and therefore the performance of the device is not influenced.

In summary, in the method of fabricating the semiconductor device of the invention, the surface defects of the dielectric layer can be effectively removed, and therefore the surface roughness of the dielectric layer can be significantly decreased. Thus, the process window of the following patterning processes such as photolithography and etching processes can be increased, and bridge defects, cracks, peeling or leakage current of the device can be avoided. Besides, with the method of the invention, the adhesion of the dielectric layer to the subsequent film can be greatly improved. In other words, with the method of the invention, the dielectric layer of the semiconductor device can be formed with low surface defect, low roughness and high adhesion to another material layer, so that the performance of the device can be greatly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a semiconductor device, comprising:
    providing a substrate;
    forming a dielectric layer on the substrate, wherein the dielectric layer comprises a first portion adjacent to the substrate and a second portion adjacent to the first portion; and
    treating the dielectric layer with nitrogen trifluoride ($NF_3$) to remove the second portion of the dielectric layer and therefore expose the first portion of the dielectric layer.

2. The method of claim 1, wherein the dielectric layer comprises silicon oxide, silicon nitride, silicon oxynitride or a combination thereof.

3. The method of claim 1, wherein the dielectric layer comprises an interlayer dielectric layer, a dielectric layer between metal layers or a protection layer.

4. The method of claim 1, wherein the step of treating the dielectric layer with NF3 comprises implanting nitrogen and fluorine into a surface portion of the first portion, so as to form the surface portion implanted with nitrogen and fluorine.

5. The method of claim 4, wherein a thickness ratio of the surface portion implanted with nitrogen and fluorine to the first portion of the dielectric layer ranges from 1/150 to 1/14.

6. The method of claim 4, wherein a thickness of the surface portion implanted with nitrogen and fluorine ranges from 1 to 250 angstroms.

7. The method of claim 1, wherein a thickness of the second portion ranges from 50 to 1,000 angstroms.

8. The method of claim 1, wherein the step of treating the dielectric layer with NF3 comprises modulating at least one process parameter, and the process parameter comprises a radio frequency (RF) power, a flow rate of $NF_3$, a flow rate of a carrier gas, a flow rate of $NH_3$, a flow rate of argon, a servo pressure or a combination thereof.

9. The method of claim 8, wherein the carrier gas comprises helium.

10. The method of claim 8, wherein the RF power ranges from 20 to 200 W.

11. The method of claim 8, wherein the flow rate of $NF_3$ ranges from 35 to 250 sccm.

12. The method of claim 8, wherein the flow rate of the carrier gas ranges from 20 to 2,400 sccm.

13. The method of claim 8, wherein the flow rate of $NH_3$ ranges from 0 to 300 sccm.

14. The method of claim 8, wherein the flow rate of argon ranges from 100 to 1,000 sccm.

15. The method of claim 1, further comprising forming at least one material layer on the exposed first portion of the dielectric layer.

16. The method of claim 15, wherein the at least one material layer comprises an anti-reflection coating layer, a photoresist layer or a combination thereof.

17. A semiconductor device, comprising:
    a substrate;
    a dielectric layer, disposed on the substrate and comprising a surface portion implanted with nitrogen and fluorine, wherein a thickness ratio of the surface portion to the dielectric layer ranges from 1/150 to 1/14.

18. The semiconductor device of claim 17, wherein the dielectric layer comprises silicon oxide, silicon nitride, silicon oxynitride or a combination thereof.

19. The semiconductor device of claim 17, wherein the dielectric layer comprises an interlayer dielectric layer, a dielectric layer between metal layers or a protection layer.

20. The semiconductor device of claim 17, further comprising at least one material layer disposed on the dielectric layer.

21. The semiconductor device of claim 20, wherein the at least one material layer comprises an anti-reflection coating layer, a photoresist layer or a combination thereof.

* * * * *